United States Patent
Mu et al.

(10) Patent No.: US 12,230,879 B2
(45) Date of Patent: Feb. 18, 2025

(54) SYSTEM AND METHOD FOR GROUND FENCING

(71) Applicant: Apple Inc., Cupertino, CA (US)

(72) Inventors: Xiaofang Mu, San Jose, CA (US); Chi V Pham, San Jose, CA (US); Mingjuan Zhu, Saratoga, CA (US); Bo Tong Deng, Santa Cruz, CA (US); Bo Zhang, San Jose, CA (US); Srinivasa Yasasvy Sateesh Bhamidipati, Milpitas, CA (US); Vineet Nayak, Sunnyvale, CA (US); Daniel C Kong, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 239 days.

(21) Appl. No.: 17/738,787

(22) Filed: May 6, 2022

(65) Prior Publication Data
US 2023/0361460 A1     Nov. 9, 2023

(51) Int. Cl.
*H05K 1/02* (2006.01)
*H01L 23/498* (2006.01)
(Continued)

(52) U.S. Cl.
CPC ....... *H01Q 1/526* (2013.01); *H01L 23/49827* (2013.01); *H01L 23/552* (2013.01);
(Continued)

(58) Field of Classification Search
CPC .. H05K 1/0221; H05K 1/0222; H05K 1/0225; H05K 1/0227
See application file for complete search history.

(56) References Cited

U.S. PATENT DOCUMENTS

2009/0256752 A1   10/2009  Akkermans et al.
2020/0006846 A1    1/2020  Lasiter et al.
(Continued)

FOREIGN PATENT DOCUMENTS

WO      2022005265 A1    1/2022

OTHER PUBLICATIONS

Steve Hageman, "Via spacing on high-performance PCBs," EDN, Feb. 6, 2013, accessed from https://www.edn.com/via-spacing-on-high-performance-pcbs/ on Feb. 8, 2022, 14 pages.
(Continued)

*Primary Examiner* — Jeremy C Norris
(74) *Attorney, Agent, or Firm* — FLETCHER YODER PC

(57) ABSTRACT

Techniques to reduce signal interference between wired signals communicated within an electronic device and wireless signals transmitted to or received from antennas of the electronic device are disclosed. The electronic device includes an interposer with an inner fence and an outer fence having offset gaps to prevent a pathway otherwise formed by overlapping tabs, where the pathway allows noise leakage from the wired signals. In some embodiments, the electronic device (e.g., in a main logic board package) includes a ground fencing of ground vias to prevent the noise leakage from harmonics associated with signal vias communicating the wired signals. The spacing between the ground vias is based on frequencies of signals that the ground vias are intended to block.

20 Claims, 7 Drawing Sheets

(51) Int. Cl.
  *H01L 23/552* (2006.01)
  *H01Q 1/22* (2006.01)
  *H01Q 1/48* (2006.01)
  *H01Q 1/52* (2006.01)

(52) U.S. Cl.
  CPC ............ *H01Q 1/2283* (2013.01); *H01Q 1/48* (2013.01); *H05K 1/0222* (2013.01); *H01L 2223/6677* (2013.01)

(56) References Cited

U.S. PATENT DOCUMENTS

| | | |
|---|---|---|
| 2020/0091608 A1 | 3/2020 | Alpman et al. |
| 2020/0093040 A1 | 3/2020 | Yun et al. |
| 2020/0303799 A1 | 9/2020 | Wang et al. |
| 2021/0014971 A1 | 1/2021 | Wang et al. |
| 2022/0272834 A1* | 8/2022 | Westwood ......... G01R 31/2889 |

OTHER PUBLICATIONS

Soonyong Lee, et al., "The Effect of via Spacing on the Signal Integrity Performance of PCB with Slotted Ground," International Symposium on Antennas and Propagation, Nov. 23, 2010, 4 pages.
Extended European Search Report for European Patent Application No. 2368039.8 dated Sep. 12, 2023; 12 pgs.

* cited by examiner

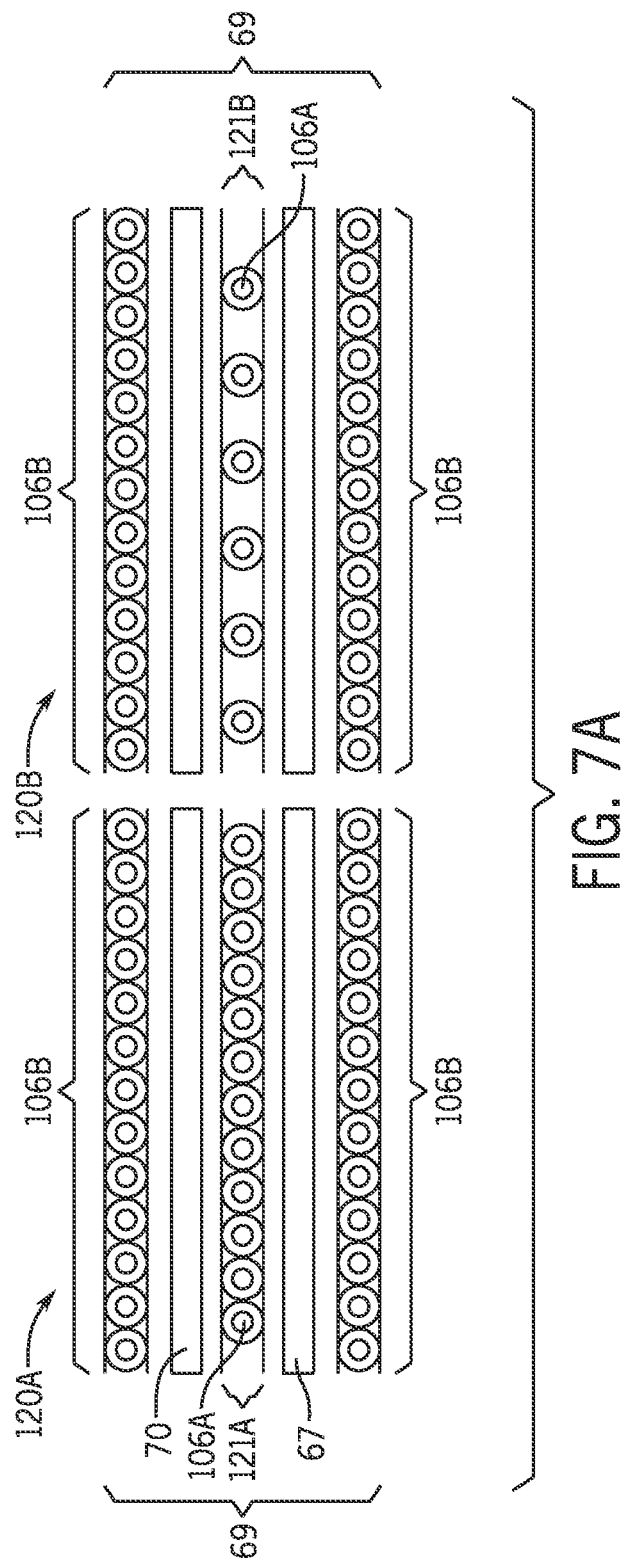

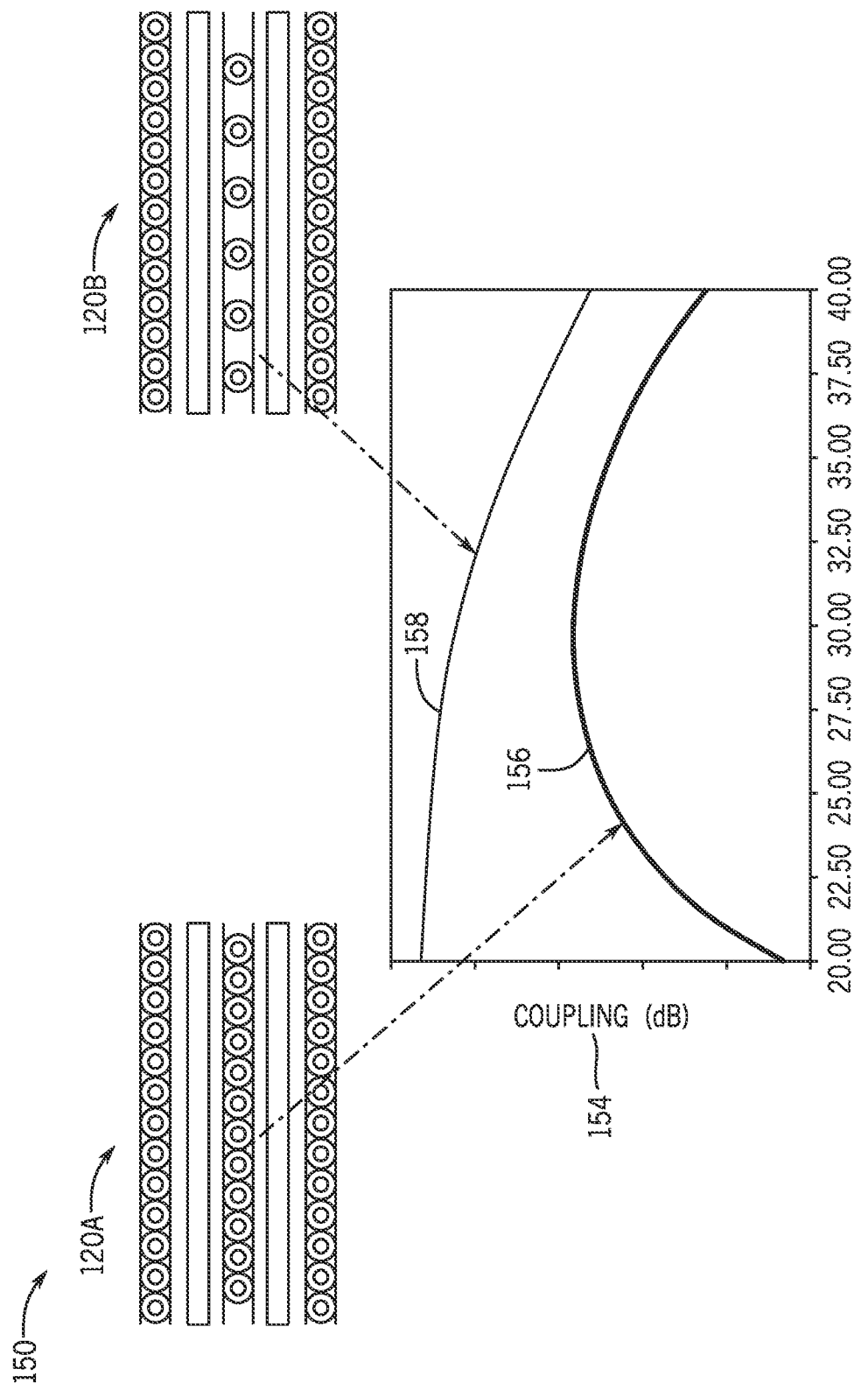

SYSTEM AND METHOD FOR GROUND FENCING

BACKGROUND

The present disclosure relates generally to wireless communication, and more specifically to reducing interference with transmitted or received wireless signals in a wireless communication device that also communicates various types of signals within the wireless communication device.

In an electronic device, a transmitter and a receiver may each be coupled to an antenna to enable the electronic device to both transmit and receive wireless signals. The electronic device may also include other components, such as chips, circuitry, and the like, to support the wireless signal transmission, provide additional functionality, or both. Often, the supporting functionality and the additional functionality may be provided by other electrical signals that are communicated in the electronic device. However, these signals may negatively impact and interfere with the wireless signals that are transmitted from or received at the antenna.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes one or more main logic boards, such as two main logic boards, and an interposer. The two main logic boards include circuitry that, in operation, emits a signal from a signal via having a frequency that overlaps with a radio frequency. The interposer may connect the two main logic boards and includes a discontinuous inner plating fence and a discontinuous outer plating fence. The discontinuous inner plating fence at least partially blocks the signal and includes a first gap. The discontinuous outer plating fence at least partially surrounds the discontinuous inner plating fence. The discontinuous outer plating fence at least partially blocks the signal and includes a second gap, where the first gap is offset from the second gap.

In another embodiment, a radio frequency package, includes an antenna and a main logic board package. The antenna transmits and receives wireless signals having a radio frequency. The main logic board includes one or more main logic boards and multiple ground vias. The one or more main logic boards communicate wired signals using multiple signal vias. The multiple ground vias are disposed around the multiple signal vias. The multiple ground vias form a ground fence around the multiple signal vias.

In yet another embodiment, a wireless communication board package, includes multiple signal vias and multiple ground vias. The multiple signal vias communicate wired signals within the wireless communication board package. The multiple ground vias are disposed around the multiple signal vias forming a ground fence around the plurality of signal vias. A spacing between each of the multiple ground vias is based at least in part on a degree of coupling between wireless signals communicated from the wireless communication board package and harmonic signals associated with the wired signals.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

FIG. 7A is a comparative diagram of signal coupling based on the spacing between ground vias, according to embodiments of the present disclosure;

FIG. 8 is a graph of signals coupling across a range of frequencies, according to embodiments of the present disclosure;

DETAILED DESCRIPTION OF SPECIFIC EMBODIMENTS

Figure 1:
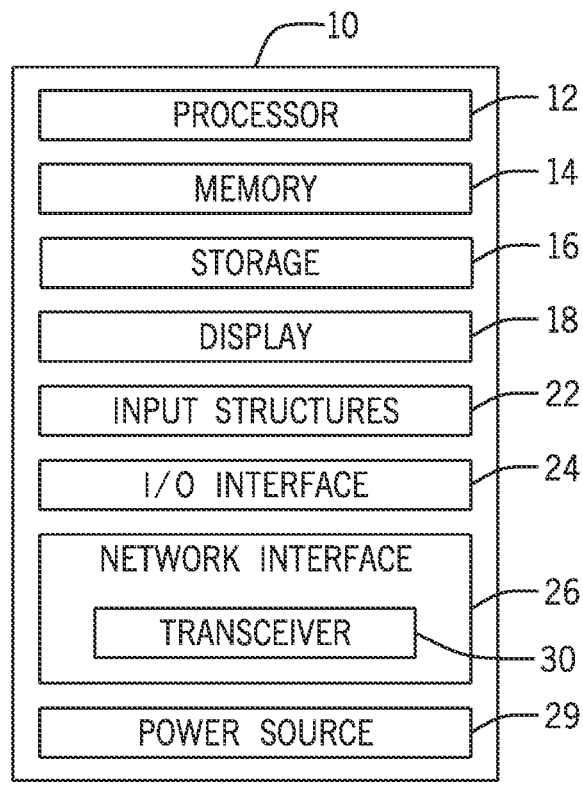
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. As used herein, "ground fencing" or "ground fence" refers to a via fence of one or more ground vias. The via fence is a structure that may be used in planar electronic circuits to improve isolation between components and/or signals that may otherwise be coupled by electromagnetic fields. The via fence may include a row of vias or via holes that, when spaced close enough together, form a barrier to electromagnetic wave propagation in a substrate. In particular, the ground vias may connect to a ground point so that printed circuit boards coupling to the ground vias share a common ground point. As used herein, a "wired signal" refers to data that is communicated using non-wireless means, such as over a metal wire or optical fiber. Wired signals may include signals that are internally communicated within an electronic device. For example, wired signals may include clock signals, power signals, data signals, peripheral component interconnect express (PCIe) signals, the application processor (AP) signals, baseband processor (BB) signals, ground signals, and the like.

This disclosure is directed to reducing noise from interfering with wireless signals transmitter or received (e.g., communicated) over millimeter wave (mmWave) frequencies (e.g., 24-300 gigahertz (GHz)). In particular, a main logic board (MLB) of an electronic device (e.g., wireless communication device) may include one or more vias to communicate signals (e.g., signal vias), such as signals internal to the electronic device (e.g., peripheral component interconnect express (PCIe) signals, application processor (AP) signals, and baseband processor (BB) signals), that may generate harmonic signals. These harmonic signals may interfere with wireless signals transmitted from or received at one or more antennas of the electronic device, and thus, decrease communication quality at the electronic device.

To prevent or reduce the interference, an electronic device may include grounding materials, such as ground pins, ground vias, ground plating, and the like. Additionally, an interposer (e.g., a substrate) may provide electrical interfacing or mechanical support to the electronic device. The grounding materials, such as the ground plating, may be disposed around the interposer to reduce or prevent noise leakage from inside the interposer to outside the interposer, or vice versa (e.g., from the main logic board). The interposer may include a discontinuous inner plating fence and a discontinuous outer plating fence, which surrounds the discontinuous inner plating fence. The interposer may be disposed on top of to a main logic board of the electronic device. Moreover, the interposer may include ground vias between the discontinuous inner plating fence and the discontinuous outer plating fence. The ground vias may block harmonic signals emitted from signal vias.

The ground plating around the interposer, the structure of interposer, or both, may be limited based on manufacturing constraints with respect to the interposer. For example, manufacturing or testing the electronic devices may require access to certain areas of the interposer, such as to pick up or clamp onto the electronic device. As such, the interposer may have tabs (e.g., gaps or portions that are cut out of the interposer) to facilitate picking up and moving the electronic device, forming the discontinuous fences of the interposer. However, for some interposers, the tabs may overlap and create pathways for the harmonic signals to move within the electronic device, such as from a signal via towards an antenna. In this way, the harmonic signals flowing through the pathways may interfere with wireless signals transmitted by or received at the antenna.

Embodiments herein provide various apparatuses and techniques to reduce signal interference among various signals, such as between signals communicated within the electronic device and signals transmitted to or received from the one or more antennas of the electronic device. To do so, the embodiments disclosed herein include the interposer having offset tabs rather than overlapping tabs that may otherwise result in pathways for the noise to flow. By offsetting the tabs in a manner so that they do not overlap, the pathway is removed, preventing or reducing noise from flowing to outside the interposer the antenna.

In some embodiments, vias for signals (e.g., signal vias) and ground (e.g., ground vias) may be disposed on the interposer so that the ground vias form a fence around the signal vias, thus preventing noise leakage generated by signals communicated through the signal vias from passing through. That is, the ground vias may effectively substitute for or provide the shielding of the ground plating removed due to the manufacturing constraints associated with the interposer (e.g., provide a ground plating effect). In some cases, the ground vias may be moved and/or redefined from previous interposer designs rather than added for additional ground vias, thus avoiding the increase cost of adding additional components. For example, an unused via and/or a signal via, may be redefined (e.g., reconfigured) as a ground via. In this manner, a ground functionality may be added to an existing via without adding more vias. In additional or alternative embodiments, spacing between the ground vias may be based on a threshold signal quality for the wireless signals. That is, the distance may prevent or block harmonic signals generated by signals communicated through the signal vias by degrading the harmonic signals to a noise level of 3 decibels (dB) or less. For example, to provide sufficient shielding from noise, the ground vias may disposed at a distance from one another of approximately $\frac{1}{60}^{th}$ of one wavelength (e.g., of a signal having an mmWave frequency) or 200 micrometers (µm). In some embodiments, the distance may be between 85 µm and 135 µm. Additionally, the spacing between the ground vias may be relatively larger when blocking harmonic signals emitted from the signal vias having relatively weaker power, and vice versa.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities. For example, the instructions may cause the processor 12 to provide functionality of processing wireless signals, transmitting wireless signals, receiving wireless signals, or any combination hereof, as well as communicating other signals (e.g., non-wireless signals) between boards (e.g., a first main logic board and a second main logic board connected to an interposer) and components of the electronic device 10.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, a non-terrestrial network, and so on. In particular, the network interface 26 may include, for example, one or more interfaces for using a Release-15 cellular communication standard of the 5G specifications that include the millimeter wave (mmWave) frequency range (e.g., 24-300 GHz) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
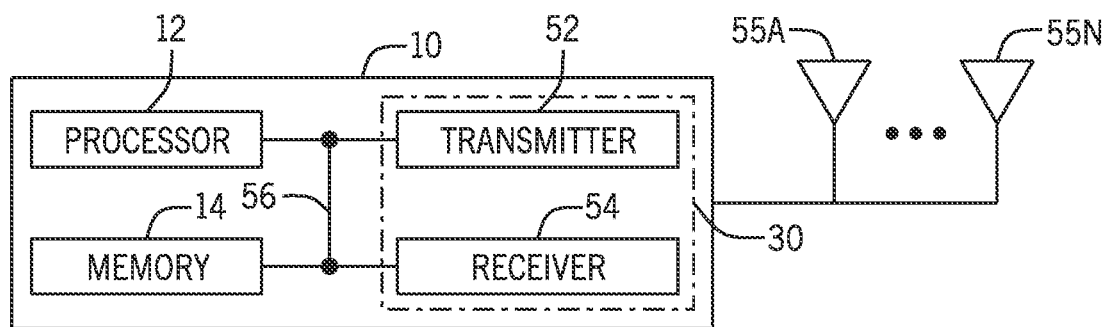
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or one or more antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
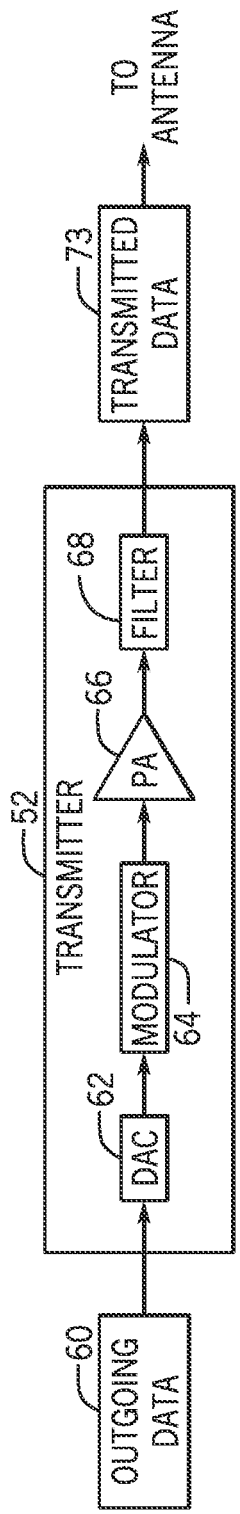
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 73 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 4:
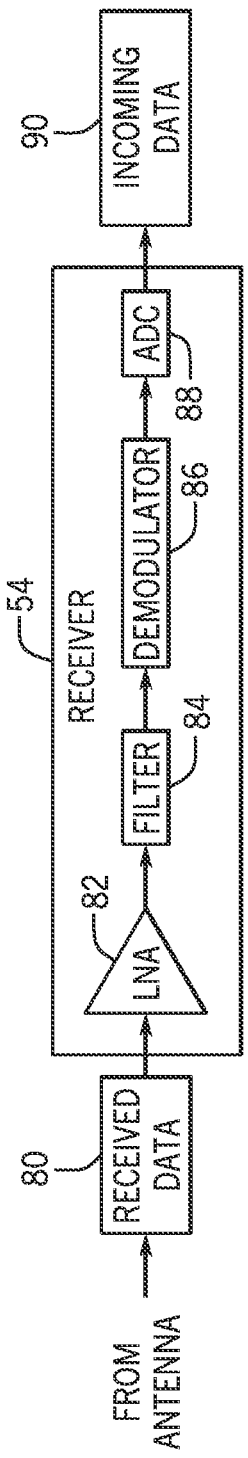
FIG. 4 is a schematic diagram of a receiver of the electronic device of FIG. 1, according to embodiments of the present disclosure.

FIG. 4 is a schematic diagram of the receiver 54 (e.g., receive circuitry), according to embodiments of the present disclosure. As illustrated, the receiver 54 may receive received data 80 from the one or more antennas 55 in the form of an analog signal. A low noise amplifier (LNA) 82 may amplify the received analog signal to a suitable level for the receiver 54 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include a mixer and/or a digital down converter.

As previously discussed, the electronic device 10 may transmit and receive wireless signals from the one or more antennas 55, as discussed with respect to FIGS. 2-4. The electronic device 10 may also include one or more boards, such as one or more main logic boards (MLBs) with one or more components that facilitate transmitting and/or receiving other types of signals within the electronic device 10. For example, the signals may include peripheral component interconnect express (PCIe) signals, application processor (AP) signals, and baseband processor (BB) signals, clock (CLK) signals, power (PWR) signals, data signals, and the like. As such, such signals may have frequencies in a baseband range (e.g., a near-zero frequency of a signal that has not been modulated) or an intermediate range (e.g., between the baseband range and a radio frequency range).

By way of example, the electronic device 10 may include a bottom main logic board and a top main logic board that is stacked on top of the bottom main logic board, and the two main logic boards may be connected by an interposer. The main logic boards, stacked and connected via the interposer, may form a main logic board package. As previously discussed, the interposer may provide an electrical interface for the main logic boards (e.g., to other components of the electronic device 10) and/or mechanical support to the electronic device 10. As will be discussed herein, the main logic boards may include signal vias (e.g., signal pins) for communicating the various signals. In some instances, grounding materials may be applied as a plating in the electronic device 10 and/or as part of the interposer, such as in the form of a copper plating. The grounding material may reduce interference between the wireless signals communicated outside the interposer and other signals generally communicated within the interposer, such as harmonic signals generated by wired signals internal to the electronic device 10 (e.g., signals communicated over wire, PCIe signals, the AP signals, BB signals, and the like).

Often, an antenna 55 may be placed in close proximity to the main logic boards. For example, the electronic device 10 may include an antenna 55 that is disposed underneath the bottom main logic board. That is, the antenna 55 used for communicating wireless signals may be disposed in close proximity to the signal vias used for communicating the wired signals. Due to mechanical constraints, such as for use during manufacturing, the interposer may include portions that are cut out of the inner and outer fence of the interposer, forming gaps or tabs in the fences. As such, the grounding material around the interposer may also include corresponding tabs, creating a pathway through the tabs for signals or noise (e.g., unintended interference) to flow through and affect the wireless signals sent or received via the antenna 55. For example, to enable a mechanical device to pick up the main logic boards in a manufacturing assembly or for another manufacturing purpose, the interposer may include tabs that enable the mechanical device to latch, hook into, or otherwise facilitate picking up the main logic boards. As will be discussed in detail with respect to FIG. 5, overlapping gaps or tabs in an inner fence of the interposer and/or an outer fence of the interposer may result in pathways for noise leakage. Harmonic signals generated by signals communicated through the signal vias may leak through the pathways and interfere with wireless signals communicated from the antennas 55. Moreover, in some embodiments, the interfering signals may have more power and thus may interfere more significantly with signals transmitted or received at the antenna 55 that is disposed closest to one or more signal vias.

Figure 5:
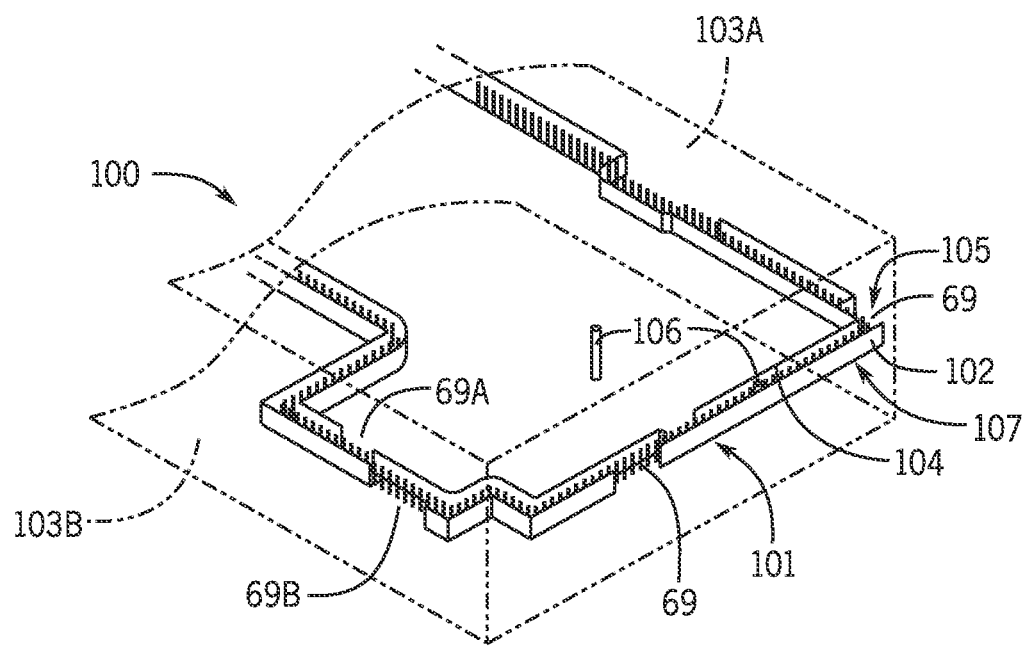
FIG. 5 is a schematic diagram of a portion of a logic board package of the electronic device of FIG. 1 having an interposer with outer and inner ground fences that prevent signal interference, according to embodiments of the present disclosure.

FIG. 5 is a schematic diagram of a portion of a logic board package 100 (e.g., a partial logic board) of the electronic device of FIG. 1 having an interposer 101 with an outer fence 102 (e.g., an outer ground fence) and an inner fence 104 (e.g., an inner ground fence) that prevents or blocks signal interference (e.g., the harmonic signals), according to embodiments of the present disclosure. Generally, the interposer 101 may couple a first board to a second board, such as a top main logic board 103A (e.g., first main logic board) to a bottom main logic board 103B (e.g., second main logic board), by stacking the main logic boards 103A, 103B (collectively 103)) on a top surface 105 and a bottom surface 107 of the interposer 101. That is, the top main logic board 103A may be stacked on top of the interposer 101, which may be stacked on top of the bottom main logic board 103B, forming a main logic board package 100. The interposer 101 may include an outer fence 102 and an inner fence 104. The outer fence 102, the inner fence 104, or both, may include grounding material, such as copper, to provide shielding from noise. For example, the inner fence 104, the outer fence 102, or both, may be plated with grounding material that prevents the harmonic signals generated by signals communicated through the signal vias from passing through. The outer fence 102, the inner fence 104, or both, may provide structural or mechanical support, for example, between the top main logic board and the bottom main logic board. That is, the interposer 101 may include structural material to provide the structural support, which may include metal, dielectric material, silicon, and the like.

In some embodiments, the outer fence 102 and/or the inner fence 104 may provide borders around vias 106. As will be discussed herein, the vias 106 may provide a variety of signal communications or provide couplings to ground. In particular, the vias 106 may include ground vias that provide couplings to ground, as well as signal vias that communicate the internal signals previously discussed (e.g., signals communicated over wire, PCIe signals, the AP signals, BB signals, and the like). In some embodiments, the vias 106 may provide electrical interfaces for the interposer 101 to facilitate communication between the top main logic board 103A and bottom main logic board 103B that are coupled to the interposer 101. As will be discussed with respect to FIG. 6, the signal vias may communicate non-wireless or wired signals. As previously discussed, these signals (or harmonics generated by the signals) may interfere with wireless signals that are concurrently communicated from the one or more antennas 55 of the electronic device 10. The interference may be greater at an antenna 55 disposed proximate to one or more vias communicating the wired signals than an antenna 55 disposed further away from the one or more vias 106.

As previously discussed, the inner fence 104 and/or outer fence 102 of the interposer 101, the structure of interposer 101, or both, may be limited based on manufacturing constraints with respect to the interposer 101. As such, the interposer 101 may have gaps or tabs 69 (e.g., cut-out portions that are cut out of the interposer 101) in the outer fence 102, the inner fence 104, or both, to facilitate picking up and moving the electronic device 10 (e.g., by a clamp-like apparatus a manufacturing or testing device). That is, the outer fence 102 and/or the inner fence 104 may be discontinuous due to having one or more gaps 69, such as a first gap 69A of the inner fence 104 and a second gap 69B of the outer fence. As a result, the removed portions may remove shielding of the interposer 101 at the tabs 69. If the gaps 69 overlap (e.g., such that at least a portion of a gap 69A of the inner fence 104 is disposed opposite or alongside at least a portion of a gap 69B of the outer fence 102), pathways may be created for harmonic signals to move through or past the inner fence 104 and the outer fence 102, such as from a signal via 106 towards an antenna 55. That is, the signal via 106 may be disposed on one or more of the main logic boards 103 and inside the inner fence 104, such that the harmonic signals may flow from the one or more of the main logic boards 103 through the gap 69A of the inner fence 104, as well as through the gap 69B of the outer fence 102 when the gaps 69 overlap. In that case, the harmonic signals (or noise) generated by signals communicated within the electronic device 10 (e.g., wired signals) may leak out from the main logic boards 103 through the interposer 101 and interfere or couple with wireless signals communicated from the antenna 55. That is, frequencies of the harmonic signals may include a frequency range also used for transmitting or receiving the wireless signals, such as mmWave frequencies.

To reduce or prevent signal interference among various signals, such as between signals communicated within the electronic device 10 (e.g., harmonic signals generated by such signals) and signals transmitted to or received from the antenna 55 of the electronic device 10, the interposer 101 may have offset gaps 69 as shown in FIG. 5 rather than overlapping gaps that may otherwise result in pathways for the noise to flow. In particular, by offsetting the gaps 69 in a manner so that they do not overlap (e.g., so that a gap 69A of the inner fence 104 is not positioned opposite that of a gap 69B of the outer fence 102), the pathway is removed, preventing or reducing noise from flowing to outside the interposer 101 to the antenna 55, as well from noise flowing from outside to inside the interposer 101.

Figure 6:
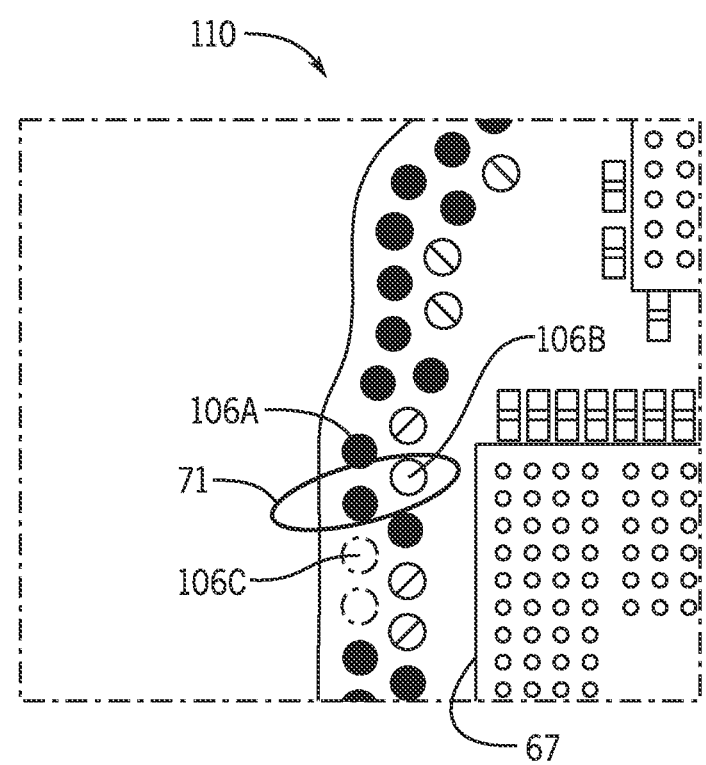
FIG. 6 is a schematic diagram of ground fencing formed by ground vias spaced apart from one another to prevent signal interference, according to embodiments of the present disclosure.

Additionally or alternatively to the offset gaps 69, ground fencing, as implemented by ground vias, may prevent or reduce noise from flowing from inside the interposer 101 to outside the interposer 101 to the antenna 55, as well from noise flowing from outside to inside the interposer 101. To illustrate, FIG. 6 is a schematic diagram of ground fencing 110 formed by ground vias 106A distributed in a pattern that prevents or blocks signal interference (e.g., the harmonic signals), according to embodiments of the present disclosure. Although the embodiments discussed herein describe the ground fencing 110 as being disposed on one or more of the main logic boards 103, the ground fencing 110 may additionally or alternatively be disposed within the interposer 101 or elsewhere on the main logic board package 100 to prevent noise leakage, to and from the main logic board package 100.

As shown, the vias 106 may include ground vias 106A (depicted by a solid pattern) and signal vias 106B (depicted by an unfilled pattern). The vias 106 may also include unused vias 106C (depicted by a horizontal line pattern) that are not configured or designated for a particular use, but may be later or dynamically configured to a particular use, such as for communicating signals or provide grounding. As previously mentioned, the signal vias 106B may communicate a variety of wired signals 67 (e.g., internal signals), such as clock signals, power signals, data signals, PCIe signals, the AP signals, BB signals, ground, and the like. By way of example, an application processor (AP) may communicate with a baseband (BB) processor via a peripheral component interconnect express (PCIe) signal using one or more of the signal vias 106B. By way of other examples, the AP may communicate with a wireless local access network (WLAN) via PCIe signals, the AP may also deliver a PCIe reference clock (REF CLK) to the WLAN or BB, and so forth. Such signals may have frequencies in a baseband range (e.g., a near-zero frequency of a signal that has not been modulated) or an intermediate range (e.g., between the baseband range and a radio frequency range). As previously mentioned, harmonic signals or noise generated by these wired signals 67 may leak out from the main logic boards 103 through the interposer 101 without a noise-canceling structure or a noise-shielding structure present, and the noise may interfere with wireless signals communicated from the antennas 55.

As such, a particular pattern of ground vias 106A forming a ground fencing 110, as shown in FIG. 6, may provide the noise-shielding structure. Specifically, the ground vias 106A of the ground fencing 110 may be disposed in a manner that facilitates shielding for the antennas 55 from the noise leakage (e.g., harmonic signals) caused by the wired signals 67 communicated via the signal vias 106B. In some embodiments, the ground vias 106A may also shield against noise leakage from circuitry on the main logic boards 103. To provide effective shielding, one or more ground vias 106A are disposed in a fence-like structure forming the ground fencing 110 around the one or more signal vias 106B, such that the one or more signal vias 106 are encircled, surrounded, or otherwise blocked in at least a direction between the one or more signal vias 106 and an antenna 55. In particular, the one or more ground vias 106A may reduce or prevent noise from leaking outside of the main logic boards 103, the interposer 101, or both, and thus, reduce or prevent the noise from interfering with the wireless signals.

By way of example, a ground via 106A in a harmonics channel 71 (depicted by the solid line circle) may block harmonic signals from the wired signals 67 that may otherwise flow through the harmonics channel 71. Specifically, if the ground via 106A was instead removed or replaced with an unused via 106C so that the harmonics channel 71 includes no ground vias 106A (e.g., having two unused vias 106C), a gap may exist in the ground fencing 110. The gap may allow harmonic signals from the signal vias 106B to flow through this harmonics channel 71 because the signal vias 106B would not be sufficiently blocked by any grounding materials, such as the ground vias 106A in the ground fencing 110. As such, the ground via 106A in the ground fencing 110 of the harmonics channel 71 may decrease the spacing between ground vias 106A (e.g., unshielded area) in the ground fencing 110 to sufficiently provide grounding around the signal vias 106, and thus block harmonic signals generated from the signal vias 106 from passing through the ground vias 106A, and possibly to an antenna.

In some embodiments, the spacing or distance between the ground vias 106A (e.g., a ground via 106A and a next closest ground via 106A) of the ground fencing 110 may be based on a threshold signal quality for the wireless signals, frequencies of the signals that the ground vias 106A are intended to block, or both. To illustrate, FIG. 7A shows a comparison of signal coupling diagrams 120 where the coupling between signals is based on the spacing between ground vias 106A, according to embodiments of the present disclosure. The coupling that occurs may be between wireless signals 70 that are transmitted, received, or both, from one or more antennas 55, and wired signals 67 and/or harmonic signals associated with the wired signals 67. As previously discussed, the antennas 55 may communicate the wireless signals 70 over a range of frequencies and the harmonics of the wired signals 67 may fall within approximately the same range of frequencies, causing interference with wireless signals 70. The signal vias 106B may communicate the wired signals 67 and the ground vias 106A may provide grounding that prevents or reduces coupling to the wireless signals 70.

In a first coupling diagram 120A, a row 121A of the ground vias 106A between the wired signals 67 and the wireless signals 70 are disposed more closely together within the ground fencing 110 than in a corresponding row 121B of a second coupling diagram 120B. As such, less ground vias 106A may be used in the ground fencing 110 in the second coupling diagram 120B than in the first coupling diagram 120A. As a result, less ground vias 106A may be manufactured when manufacturing the main logic board package 100 with the interposer 101 having the ground vias 106 as distributed in the row 121A of the first coupling diagram 120A compared to the row 121B of the second coupling diagram 120B, reducing costs and time otherwise associated with additional ground vias 106A.

Generally, the distance between the ground vias 106A in the ground fencing 110 may be a distance that provides sufficient shielding to ensure that the coupling (e.g., a degree of coupling) between the wireless signals 70 and the wired signals 67 is below a threshold. The threshold (e.g., a quality threshold) may be based on the wireless signals 70 still providing the wireless communication as intended or within a threshold signal power or quality. Thus, the distance between the ground vias 106A (e.g., a ground via 106A and a next closest ground via 106a) in the ground fencing 110 may correlate to maintaining the signal coupling below the threshold. Moreover, the distance between the ground vias 106A may be based on frequencies of the signals that the ground vias 106A are intended to block. In particular, the frequencies of the signals that the ground vias 106A are intended to block may include frequencies on which harmonic signals are known to occur for the wired signals 67 or other noise-causing components of the main logic board package 100. For example, the harmonics associated with PCIe wired signals may occur at mmWave and/or 5G frequencies and, as such, the spacing between the ground vias 106A may be sufficient for blocking noise occurring on the mmWave and/or 5G frequencies. Such spacing may include, for example, between 85 μm and 135 μm. The ground vias 106A may be spaced apart by this distance to block the noise, since the electronic device 10 may transmit and/or receive wireless signals over the these frequencies.

Figure 7B:
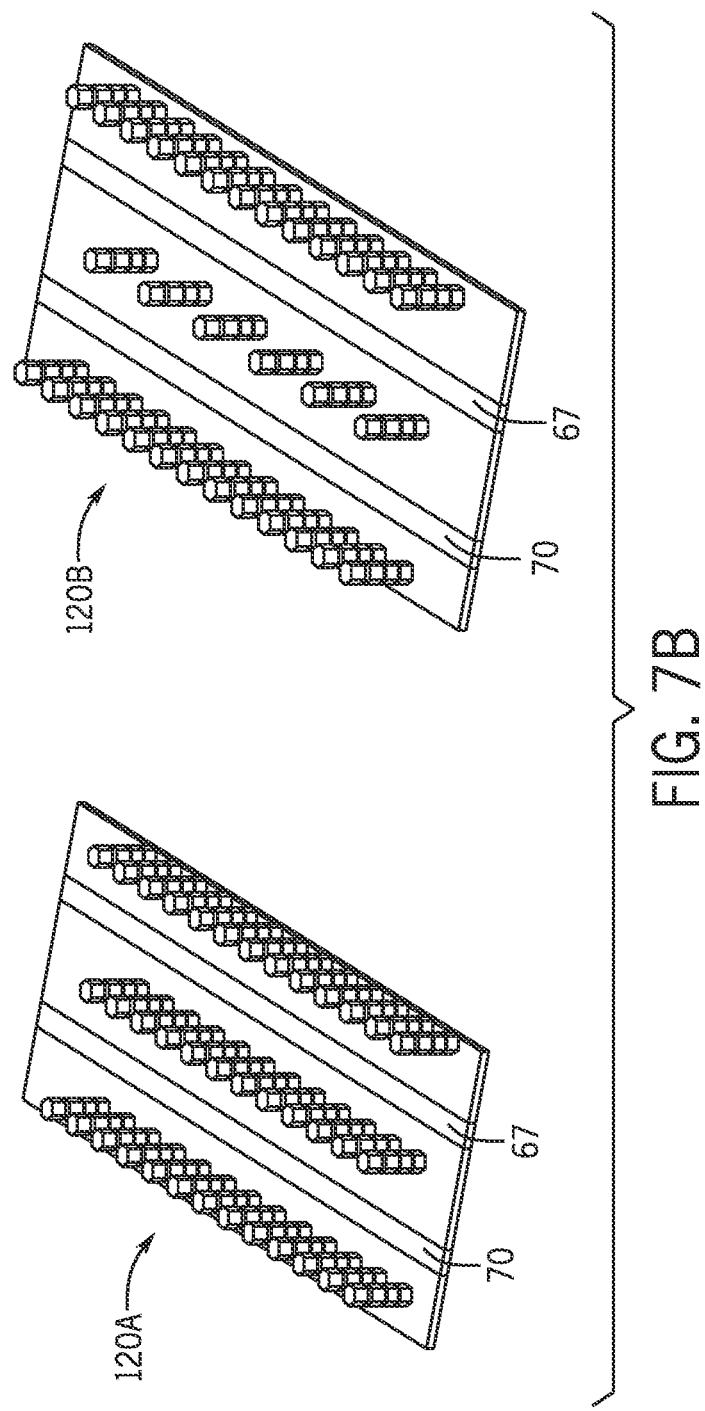
FIG. 7B is a three-dimensional view of the comparative diagram of FIG. 7A, according to embodiments of the present disclosure.

Often, the signal coupling may also be impacted by proximity of the antenna 55 to the signal via 106B communicating the wired signals 67. In particular, the distance between ground vias 106A may be relatively smaller to sufficiently block relatively stronger coupling between the wired signals 67 and the wireless signals 70. For example, while harmonic signals may occur at a particular mmWave frequency from communication of the wired signals 67 through the signal via 106B, a first antenna 55 disposed on the main logic board package 100 may transmit and receive wireless signals 70 over the particular mmWave frequency and a second antenna 55 disposed away from the main logic board package 100 may also transmit and receive wireless signals over the particular mmWave frequency. Since the first antenna 55 and the signal via 106 may be relatively closer (e.g., both are on the main logic board package 100), the resulting coupling between the wireless signals 70 from the first antenna 55 and the harmonic signals may be stronger than the resulting coupling between the wireless signals 70 from the second antenna 55 and the harmonic signals. As such, to prevent or reduce the leakage resulting from the stronger coupling, the spacing between the ground vias 106A in the ground fencing 110 closer to the first antenna 55 may be relatively smaller than the spacing between ground vias 106A closer to the second antenna 55. In the depicted embodiment, the signal coupling may be uncoupled or reduced, such that the quality of communication for the wireless signals 70 is within the quality threshold. As will be discussed with respect to FIG. 8, the ground vias 106A in the ground fencing 110 may be disposed within a range of distance from respective signal vias 106B to provide sufficient shielding against noise leakage to prevent the signal coupling. FIG. 7B is a three-dimensional view of the comparative signal coupling diagrams 120 of FIG. 7A, according to embodiments of the present disclosure. Generally, the coupling may increase as the ground vias 106A in the ground fencing 110 are spaced farther apart due to the reduced barrier otherwise provided by the closely spaced ground vias 106A. Specifically, the signal-to-noise ratio may degrade or decrease.

To illustrate, FIG. 8 is a graph 150 of the signal coupling between signals (e.g., the wired signals 67 and the wireless signals 70) across a range of frequencies, according to embodiments of the present disclosure. Specifically, the graph 150 illustrates coupling in terms of frequencies (in hertz (Hz)), such that the horizontal axis (e.g., x-axis) represents frequency 152 and the vertical axis (e.g., y-axis) represents coupling 154 (in decibels (dB)). A first curve 156 represents coupling 154 over a range of frequencies 152 for the first coupling diagram 120A of FIG. 7A and FIG. 7B. A second curve 158 represents coupling 154 over a range of frequencies 152 for the second coupling diagram 120B of FIG. 7A and FIG. 7B.

The coupling 154 may be relatively lower for the first curve 156 corresponding to the first coupling diagram 120A than the second curve 158 corresponding to the second coupling diagram 120B. However, as the frequency 152 increases and towards the higher range of frequencies 152 (e.g., mmWave frequencies), the coupling 154 may decrease for both curves 156, 158. Moreover, a coupling difference between the curves 156, 158 at the higher frequencies may be relatively smaller than the coupling difference at lower frequencies. Although the coupling 154 is lower for the first curve 156, the coupling 154 for both curves 156 and 158 across the higher range of frequencies may be below a coupling threshold of coupling 154. As such, the distance between the ground vias 106A in the ground fencing 110 discussed with respect to the second coupling diagram 120B and as indicated by the second curve 158, still provides sufficient and effective shielding to reduce noise leakage.

In some embodiments, the edge-to-edge spacing between the ground vias 106A (e.g., a spacing from respective closest edges of two ground vias 106A closest to one another) in the ground fencing 110 depicted in the first coupling diagram 120A of FIG. 7A and the corresponding coupling represented by the first curve 156 may include 120 micrometers (μm) or less, 100 μm or less, 90 μm or less, such as between 85 μm and 100 μm (e.g., 85 μm, 90 μm, and so forth). In some embodiments, the edge-to-edge spacing between ground vias 106A depicted in the second coupling diagram 120B of FIG. 7B and the corresponding coupling represented by the second curve 158 may include 110 μm or more, 130 μm or more, 140 μm or more, such as between 130 μm and 140 μm (e.g., 135 μm, 140 μm, and so forth). As previously discussed, although spacing the ground vias 106A approximately 85 μm apart may provide lower coupling and thus, a better signal-to-noise ratio, spacing the ground vias 106A at approximately 135 μm may still provide sufficient shielding against noise leakage, such that the coupling 154 is still below a threshold coupling. The threshold may be based on the wireless signals providing a predetermined level of signal quality. By way of example, ground vias 106A spaced 85 μm may result in 3 dB coupling or less, while ground vias 106A spaced 135 μm may result in 6 dB coupling or less, and the threshold coupling to provide sufficient wireless signal quality may be 6 dB or more. Moreover, as the distance between the ground vias 106A in the ground fencing 110 increases, the number of ground vias 106A used within the ground fencing 110 decreases, reducing time and costs in manufacturing the electronic device 10 with respect to the ground vias 106A. Thus, the spacing between the ground vias 106A in the diagrams 120 may result in a signal degradation of less than 3 dB and both may provide signal quality above the threshold. In some embodiments, to provide sufficient shielding from noise, the ground vias 106A may be spaced apart at a distance of approximately $1/60^{th}$ of one wavelength (e.g., of a mmWave frequency) or 200 μm or less, though, in additional or alternative embodiments, the ground vias 106A may be spaced apart at 300 μm or less, 400 μm or less, 500 μm or less, and so on. As previously discussed, the distance may be based on various factors, such as proximity of the antenna 55 to the signal vias 106 communicating the wired signals 67 that interfere with the wireless signals 70 transmitted or received from the antenna 55, a quality threshold for the wireless signals, and so forth.

Figure 9:
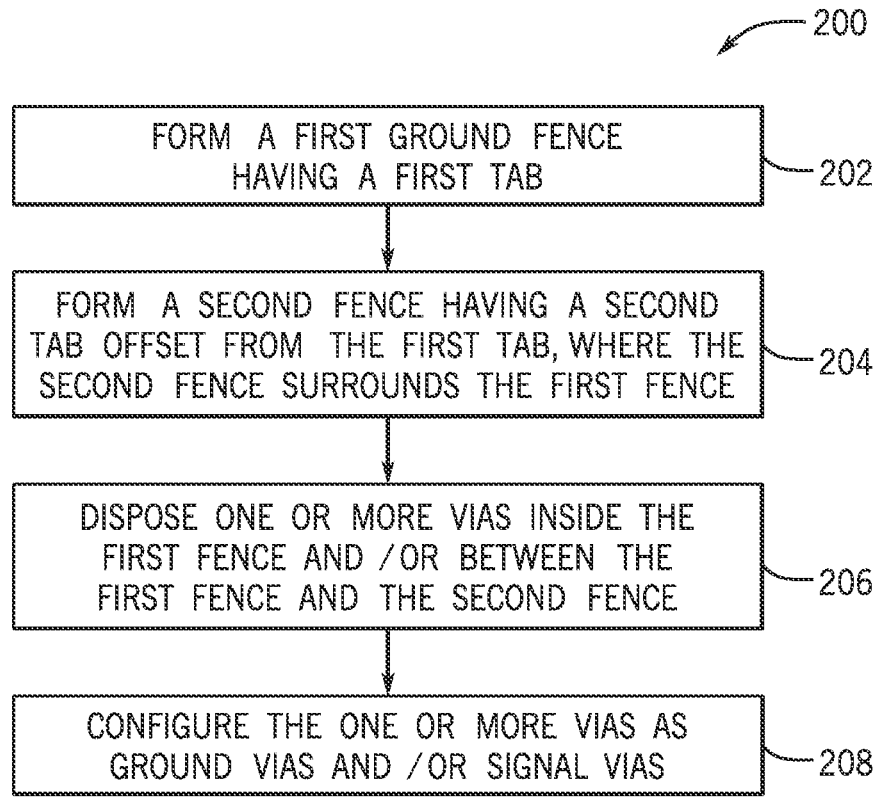
FIG. 9 is a flowchart of a method for manufacturing the ground fencing of FIG. 6, according to embodiments of the present disclosure.

FIG. 9 is a flowchart of a method 200 for the manufacturing the ground fencing 110 having the outer fence 102 and the inner fence 104 of FIG. 5, according to embodiments of the present disclosure. Any suitable device (e.g., a controller) that may control manufacturing of the electronic device 10, components of the electronic device 10, or both, such as a processor 12 for the manufacturing device and/or the electronic device 10, may perform the method 200. Similarly, any suitable device that may control manufacturing of the electronic device 10 may perform method 210, as will be discussed with respect to FIG. 10. In some embodiments, the methods 200 and 210 may be implemented by executing instructions stored in a tangible, non-transitory, computer-readable medium, such as the memory 14 or storage 16 of the manufacturing device and/or the electronic device 10, using the processor 12. For example, the methods 200 and 210 may be performed at least in part by one or more software components, such as an operating system of the manufacturing device, one or more software applications of the manufacturing device and/or the electronic device 10, and the like. While the methods 200 and 210 are described using steps in a specific sequence, it should be understood that the present disclosure contemplates that the described steps may be performed in different sequences than the sequence illustrated, and certain described steps may be skipped or not performed altogether.

In process block 202, the processor 12 forms a first ground fence (e.g., on a main logic board 103 or interposer 101), where the first fence has a first gap 69A (e.g., a tab or a cutout portion). The first fence may be part of an interposer 101, and may include the inner fence 104, as previously discussed. In particular, and also as previously discussed, the main logic board 103 may include components that interfere with other components outside of the fence 104 or interposer 101. Moreover, another main logic board (e.g., top main logic board 103A) may be stacked on top of the main logic board (e.g., bottom main logic board 103B) forming a main logic board package 100 of the electronic device 10. The fences 102, 104 may provide spacing and structural support between the two main logic boards 103. The fence 104 may be covered or plated with grounding material, such as copper to provide shielding against noise leakage (e.g., from the components inside the fence). The gaps 69 of the fence 104 may include a portion of the fence 104 that is removed, for example, for manufacturing purposes previously discussed (e.g., to pick up the main logic board package or the electronic device 10).

In process block 204, the processor 12 forms a second ground fence having a second gap 69B offset from the first gap 69A, where the second fence surrounds the first fence 104. The second fence may also be part of the interposer 101, where the second fence is the outer fence 102, as previously discussed. The second fence 102 may also be plated with copper plating and include the second tab 69B for manufacturing reasons, as discussed with respect to the first fence. However, overlapping gaps may result in a pathway for noise leakage. For example, wired signals 67 communicated from signal vias 106B on the main logic board 103 may leak outside the interposer 101 via a pathway created by the overlapping tabs, and interfere with wireless communication. In particular, harmonics associated with the wired signals 67 over a range of frequencies may interfere with the wireless signals 70 communicated over the same frequencies, such as mmWave frequencies. As such, having gaps 69 that are offset, such that they are not overlapping, may reduce or prevent noise leakage from components on the main logic board 103, the interposer 101, or both, as well from components outside the main logic board 103 to inside the main logic board 103.

In process block 206, the processor 12 may dispose one or more vias 106 inside the first fence, between the first fence and the second fence, or both. The vias 106 may communicate a variety of signals, as discussed with respect to FIG. 5. For example, the vias 106 may include ground vias 106A to provide shielding. The vias 106 may also include signal vias 106B for communicating wired signals 67 using signal vias 106B. In process block 208, the processor 12 may configure one or more of the vias 106 as ground vias 106A, signal vias 106B, or both. For example, the processor 12 may configure vias 106 on the main logic board inside the first fence as signal vias 106B to communicate the wired signals 67.

Figure 10:
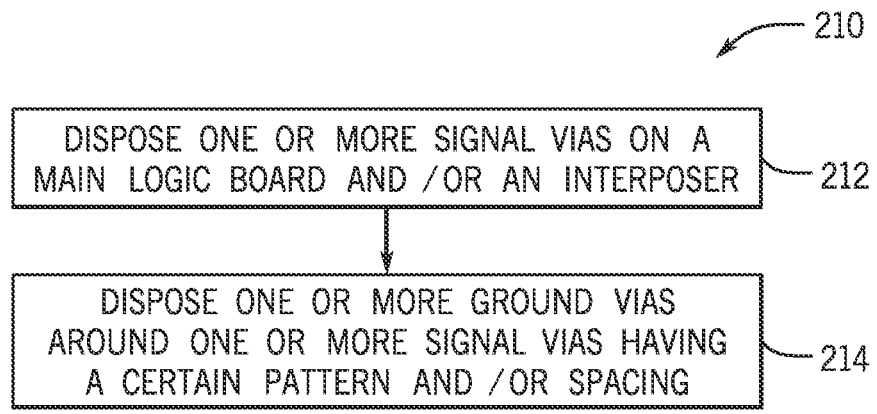
FIG. 10 is a flowchart of a method for the manufacturing the ground fencing of FIG. 7A and FIG. 7B.

FIG. 10 is a flowchart of a method 210 for the manufacturing the ground fencing 110 of FIG. 6, according to embodiments of the present disclosure. In process block 212, the processor may dispose one or more signal vias 106B on the main logic board 103 and/or the interposer 101. The vias 106B may communicate wired signals 67.

Additionally or alternatively to the offset gaps 69, ground fencing 110, as implemented by ground vias 106B, may provide shielding, as previously discussed. To form the ground fence, in process block 214, the processor 12 may dispose the one or more ground vias 106B around the signal vias 106 having a certain pattern and/or spacing. In some embodiments, the ground vias 106A may be disposed to encircle or surround the signal vias 106B that communicate wired signals 67 on the main logic board 103 and/or the interposer 101 and generate harmonic signals. The ground fencing 110 may form a barrier that may prevent or reduce noise leakage from or to the main logic board 103 and/or the interposer 101.

In additional or alternative embodiments, the distance or spacing between the ground vias 106A of the ground fencing 110 may be based on decreasing or maintaining possible signal coupling of the wireless signals 70 and the harmonic signals below a coupling threshold so that communication quality is above a quality threshold, as previously discussed. The distance between the ground via 106A and another ground via 106A in the ground fencing 110 may be a distance that provides sufficient shielding to ensure that the degree of coupling between the signals is below a threshold. The quality threshold may be based on the wireless signals 70 still providing the wireless communication as intended or within a threshold quality. Thus, the distance between the ground via 106A and another ground via 106A in the ground fencing 110 may correlate to maintaining the signal coupling below the threshold. As such, the distance between the ground via 106A and another ground via 106A may also be based on frequencies of the signals that the ground vias 106A are intended to block. In some instances, the signal coupling may correlate to proximity of a ground via 106A to a signal via 106B communicating the wired signals 67, and as such, the distance between the ground vias 106A in the ground fencing 110 may also be based on this proximity. In this manner, the methods 200 and 210 reduce or prevents noise leakage outside of an interposer 101. The methods 200 and 210 also reduce the number of ground vias 106A used to reduce or prevent the noise leakage, resulting in low manufacturing costs and low manufacturing time.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An electronic device, comprising:
   a logic board comprising a signal via; and
   an interposer coupled to the logic board, the interposer comprising:
      a discontinuous inner plating fence comprising a first cut-out portion; and
      a discontinuous outer plating fence at least partially surrounding the discontinuous inner plating fence, the discontinuous outer plating fence comprising a second cut-out portion, and the first cut-out portion being offset from the second cut-out portion.

2. The electronic device of claim 1, wherein the signal via is configured to emit a signal, and wherein the discontinuous inner plating fence or the discontinuous outer plating fence is configured to at least partially block the signal, the signal having a frequency that overlaps with a radio frequency.

3. The electronic device of claim 1, wherein the discontinuous outer plating fence and the discontinuous inner plating fence comprise grounding material or copper.

4. The electronic device of claim 1, wherein the signal via is configured to emit a signal, the signal comprising a data signal, a clock signal, a power signal, a baseband processor signal, an application processor signal, or a peripheral component interconnect express signal.

5. The electronic device of claim 1, wherein the signal via is configured to emit a signal, the electronic device comprising a plurality of ground vias disposed on the logic board or on the interposer, and the plurality of ground vias is configured to at least partially block the signal from the signal via.

6. The electronic device of claim 1, wherein the interposer comprises a plurality of ground vias positioned between the discontinuous inner plating fence and the discontinuous outer plating fence.

7. A radio frequency package, comprising:
   an antenna configured to transmit and receive wireless signals having a radio frequency; and
   a logic board package communicatively coupled to the antenna, the logic board package comprising:
      a logic board configured to communicate wired signals using a plurality of signal vias, and
      an interposer coupled to the logic board, the interposer comprising:
         a discontinuous inner plating fence comprising a first gap that provides a pathway for a signal emitted by a signal via of the plurality of signal vias; and
         a discontinuous outer plating fence at least partially surrounding the discontinuous inner plating fence, the discontinuous outer plating fence comprising a second gap, and the discontinuous outer plating fence configured to remove the pathway at the discontinuous outer plating fence.

8. The radio frequency package of claim 7, wherein the wired signals are associated with harmonic signals having a frequency overlapping the radio frequency.

9. The radio frequency package of claim 7, wherein the logic board package comprises a plurality of ground vias disposed on the logic board or on the interposer.

10. The radio frequency package of claim 9, wherein the plurality of ground vias is configured to reduce noise leakage from the plurality of signal vias, circuitry on the logic board, or both.

11. The radio frequency package of claim 9, wherein the plurality of ground vias is configured to at least partially block the signal from the signal via.

12. The radio frequency package of claim 9, wherein the plurality of ground vias form a ground fence around the plurality of signal vias.

13. The radio frequency package of claim 12, wherein the ground fence is configured to decrease coupling between the wireless signals and harmonic signals associated with the plurality of signal vias to less than 3 decibels.

14. The radio frequency package of claim 12, wherein the ground fence is configured to provide a ground plating effect around the plurality of signal vias.

15. A wireless communication board package, comprising:
   a plurality of signal vias configured to communicate wired signals within the wireless communication board package;
   a discontinuous inner plating fence comprising a first gap; and
   a discontinuous outer plating fence at least partially surrounding the discontinuous inner plating fence, the discontinuous outer plating fence comprising a second gap to facilitate picking up the wireless communication board package, and the first gap being offset from the second gap.

16. The wireless communication board package of claim 15, wherein the wireless communication board package is configured to communicate wireless signals over millimeter wave frequencies.

17. The wireless communication board package of claim 15, wherein a signal via of the plurality of signal vias is configured to emit a signal, and wherein the discontinuous inner plating fence or the discontinuous outer plating fence is configured to at least partially block the signal, the signal having a frequency that overlaps with a radio frequency.

18. The wireless communication board package of claim 15, wherein the discontinuous outer plating fence and the discontinuous inner plating fence comprise grounding material or copper.

19. The wireless communication board package of claim 15, wherein a signal via of the plurality of signal vias is configured to emit a signal, the signal comprising a data signal, a clock signal, a power signal, a baseband processor signal, an application processor signal, or a peripheral component interconnect express signal.

20. The wireless communication board package of claim 15, comprising a plurality of ground vias positioned between the discontinuous inner plating fence and the discontinuous outer plating fence.

* * * * *